United States Patent
Wang et al.

(10) Patent No.: US 8,808,901 B2
(45) Date of Patent: Aug. 19, 2014

(54) ANODE PROTECTOR OF LITHIUM-ION BATTERY AND METHOD FOR FABRICATING THE SAME

(75) Inventors: Fu-Ming Wang, Hsinchu (TW); Hsin-Yi Wang, New Taipei (TW); Chin-Shu Cheng, Hsinchu County (TW)

(73) Assignee: National Taiwan University of Science and Technology, Taipei (TW)

( * ) Notice: Subject to any disclaimer, the term of this patent is extended or adjusted under 35 U.S.C. 154(b) by 211 days.

(21) Appl. No.: 13/410,299

(22) Filed: Mar. 2, 2012

(65) Prior Publication Data

US 2013/0177808 A1   Jul. 11, 2013

(30) Foreign Application Priority Data

Jan. 6, 2012   (TW) .............................. 101100658 A

(51) Int. Cl.
*H01M 2/16*   (2006.01)

(52) U.S. Cl.
USPC .......................................... 429/137; 429/246

(58) Field of Classification Search
CPC ........... H01M 4/48; H01M 4/52; H01M 4/62; H01M 4/583; H01M 10/0525; H01M 4/40
See application file for complete search history.

(56) References Cited

U.S. PATENT DOCUMENTS

2009/0155676 A1\* 6/2009 Zhamu et al. ................ 429/129
2011/0311882 A1   12/2011 Kim et al.

FOREIGN PATENT DOCUMENTS

| CN | 102122708 A | 7/2011 |
|---|---|---|
| JP | H11-120992 | 4/1999 |
| WO | 2006043470 | 4/2006 |
| WO | 2007086411 | 8/2007 |
| WO | 2011098233 | 8/2011 |

\* cited by examiner

*Primary Examiner* — Milton I Cano
*Assistant Examiner* — Carmen Lyles-Irving
(74) *Attorney, Agent, or Firm* — Jianq Chyun IP Office

(57) ABSTRACT

An anode protector of a lithium-ion battery and a method for fabricating the same are provided. A passivation protector (110) is formed on a surface of an anode (102) in advance by film deposition, such as atomic layer deposition (ALD). The passivation protector (110) is composed of a metal oxide having three dimensional structures, such as columnar structures. Accordingly, the present invention is provided with effective protection of the anode electrode structure and maintenance of battery cycle life under high-temperature operation.

5 Claims, 5 Drawing Sheets

ANODE PROTECTOR OF LITHIUM-ION BATTERY AND METHOD FOR FABRICATING THE SAME

CROSS-REFERENCE TO RELATED APPLICATION

This application claims the priority benefit of Taiwan application serial no. 101100658, filed on Jan. 6, 2012. The entirety of the above-mentioned patent application is hereby incorporated by reference herein and made a part of this specification.

BACKGROUND OF THE INVENTION

1. Field of the Invention

The present invention relates to a lithium-ion battery, and more particularly, relates to a lithium-ion battery having a passivation protector.

2. Description of Related Art

Much attention has been paid to the rechargeable secondary battery system since the primary battery system cannot meet the requirement of environmental protection. Lightweight batteries are necessary for portable electronic products such as the digital camera, the cell phone, or the notebook. With the rapid development and popularization of portable electronic products, there is gradually increasing demand on the lithium-ion battery, which may be repeatedly charged and discharged and has advantages such as light weight, high voltage, and high energy density. The lithium-ion battery has a higher working voltage, a greater energy density, a lighter weight, a longer lifetime, and executes environmental protection more effectively as compared to the traditional batteries such as the lead storage battery, the nickel-hydride battery, the nickel-zinc battery, and the nickel-cadmium battery. Therefore, the lithium-ion battery is one of the best candidates of the flexible battery. It is thus required to reduce the weight of the lithium-ion battery as well as to improve the durability, the output voltage, the energy density, and the safety of the lithium-ion battery. The application and development potential of the lithium-ion battery is particularly high in industrial fields such as the lightweight electro mobile, the electro mobile, and the large-scale electronic storage.

The so-called secondary lithium-ion battery is a battery in which the lithium ions move between the cathode and the anode to repeatedly charge and discharge the battery. Commercialized secondary lithium-ion batteries generally adopt meso carbon micro bead (MCMB) as the host of the anode material. In the initial cycle of charge and discharge, the surface of MCMB reacts with the electrolyte to form a solid electrolyte interface (SEI) on the anode. The solid electrolyte interface may prevent the disintegration of the surface of the anode material as well as prevent the decomposition of the electrolyte, and thus stabilize the cycle of charge and discharge. Therefore, the solid electrolyte interface has critical influence on the lifetime of the battery.

In recent years, with the application of lithium-ion battery to energy storage systems and vehicles operated with novel energy source, the market scale of the lithium-ion battery in electro mobile and power battery industries has gradually increased. Therefore, it is necessary for the lithium-ion battery to function at high temperature. The solid electrolyte interface (SEI) of the ordinary lithium-ion battery, however, is very likely to disintegrate at high temperature. This may cause the swell of the battery and the degradation of the performance, and may also shorten the lifetime of the battery.

SUMMARY OF THE INVENTION

Accordingly, the present invention is directed to a lithium-ion battery, wherein a passivation protector is formed on the surface of the anode, and the lithium-ion battery may therefore be operated at high temperature.

The present invention is further directed to a method for fabricating a lithium-ion battery, wherein a passivation protector is formed on the surface of the anode in advance.

The present invention provides a lithium-ion battery, including an anode, a cathode, a separator membrane, an electrolyte solution, and a passivation protector. The cathode is disposed opposite to the anode. The separator membrane is disposed between the anode and the cathode, wherein the separator membrane, the anode, and the cathode define an accommodation region. The electrolyte solution is accommodated in the accommodation region. The passivation protector is disposed on the surface of the anode, wherein the passivation protector is a film deposition layer and the thickness of the passivation protector is 1 nm to 1 µm.

According to an embodiment of the invention, the passivation protector includes, for example, at least one selected from the group consisting of a columnar structure oxide, a film structure oxide, a sheet structure oxide, a pin structure oxide, an array structure oxide, an irregular wrapping structure oxide, and a wire structure oxide.

According to an embodiment of the invention, the passivation protector includes a metal oxide or silicon oxide. The metal oxide is, for example, aluminium oxide ($Al_2O_3$), titanium oxide ($TiO_2$), hafnium oxide ($HfO_2$), or a mixture thereof According to an embodiment of the invention, the anode includes a material of which a potential of lithium-ion intercalation material structure is less than 2 V.

According to an embodiment of the invention, the anode includes a material selected from the group consisting of artificial graphite, natural graphite, carbon powder, carbon fibers, carbon nanotubes, LiAl, LiZn, $Li_3Bi$, $Li_3Cd$, $Li_3Sb$, $Li_4Si$, $Li_{4.4}Pb$, $Li_{4.4}Sn$, $LiC_6$, $Li_3FeN_2$, $Li_{2.6}Co_{0.4}N$, $Li_{2.6}Cu_{0.4}N$, SnO, $SnO_2$, GeO, $GeO_2$, $In_2O$, $In_2O_3$, PbO, $PbO_2$, $Pb_2O_3$, $Pb_3O_4$, $Ag_2O$, AgO, $Ag_2O_3$, $Sb_2O_3$, $Sb_2O_4$, $Sb_2O_5$, SiO, ZnO, CoO, NiO, and FeO.

According to an embodiment of the invention, the lithium-ion battery is operated at 55° C. or above.

The present invention further provides a method for fabricating an anode protector of a lithium-ion battery, including pre-providing an anode of the lithium-ion battery and forming a passivation protector with an oxide on the surface of the anode of the lithium-ion battery by a film deposition method, wherein the thickness of the passivation protector is 1 nm to 1 µm.

According to an embodiment of the invention, the film deposition method includes atomic layer deposition (ALD), chemical vapor deposition (CVD), or pulse laser deposition.

According to an embodiment of the invention, the oxide is at least one selected from the group consisting of a columnar structure oxide, a film structure oxide, a sheet structure oxide, a pin structure oxide, an array structure oxide, an irregular wrapping structure oxide, and a wire structure oxide.

Accordingly, by disposing a passivation protector with specific thickness on the surface of the anode of the lithium-ion battery, the lithium-ion battery according the present invention can be operated at high temperature (about 55° C. or above) and at the same time have a good battery efficiency. The lifetime of the lithium-ion battery can also be increased.

In addition, according to the method for fabricating the lithium-ion battery according the present invention, a passivation layer is formed on the surface of the anode prior to the package process. The method can be integrated into the existing fabrication process without altering the structure of the battery, changing the anode material or the formulation of electrolyte solution. Therefore, the fabrication cost can be reduced and the performance of the battery at high temperature can be enhanced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
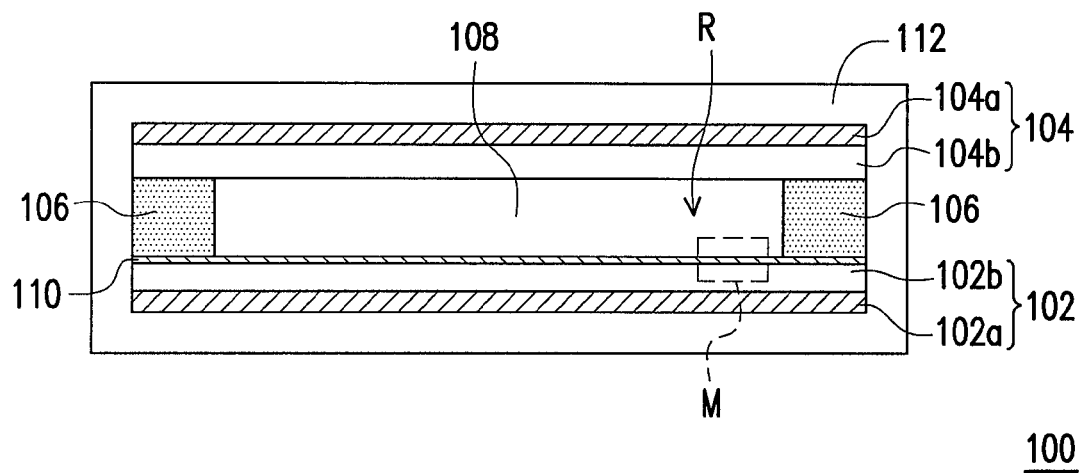
FIG. 1A is a sectional view of a lithium-ion battery according to an embodiment of the present invention.

Reference will now be made in detail to the exemplarily embodiments of the invention, examples of which are illustrated in the accompanying drawings. Wherever possible, the same reference numbers are used in the drawings and the description to refer to the same or like parts.

Figure 1B:
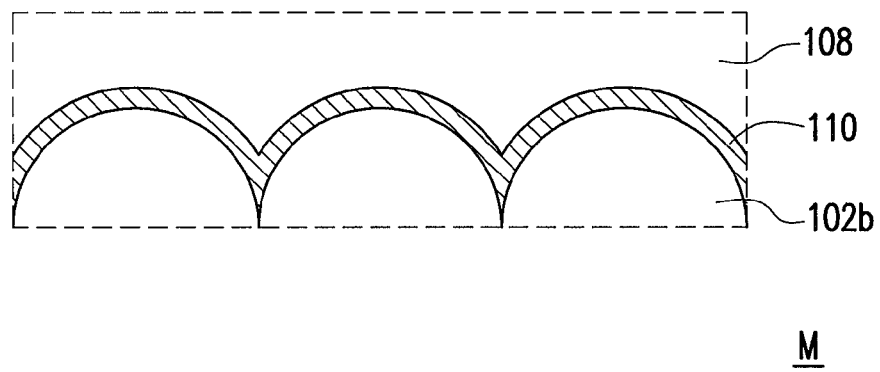
FIG. 1B is an enlarged view of the portion M in FIG. 1A.

FIG. 1A is a sectional view of a lithium-ion battery according to an embodiment of the present invention. FIG. 1B is an enlarged view of the portion M in FIG. 1A.

Referring to FIGS. 1A and 1B, a lithium-ion battery 100 includes an anode 102, a cathode 104, a separator membrane 106, an electrolyte solution 108, and a passivation protector 110. The cathode 104 is disposed opposite to the anode 102, and the separator membrane 106 is disposed between the anode 102 and the cathode 104. The anode 102, the cathode 104, and the separator membrane 106 define an accommodation region R. The electrolyte solution 108 is accommodated in the accommodation region R. The passivation protector 110 is disposed on the surface of the anode 102, wherein the passivation protector 110 is a film deposition layer. The passivation protector 110 includes an oxide, and the thickness of the passivation protector 110 is about 1 nm to 1 μm. The lithium-ion battery 100 further includes a package structure 112, which may be an ordinary aluminium foil package. The package structure 112 is used to cover the outer peripheries of the anode 102, the cathode 104, and the separator membrane 106.

The anode 102 includes an anode metal foil 102a and an anode active material 102b. The anode active material 102b may be particle-coated or sputtered on the anode metal foil 102a so as to form the anode. The anode metal foil 102a is, for example, a copper foil, an aluminium foil, a nickel foil, or a highly conductive stainless steel foil. The anode active material 102b is, for example, a material of which the potential of lithium ion intercalation material structure is less than 2 V. The anode active material 102b may be selected from the group consisting of carbon material, LiAl, LiZn, $Li_3Bi$, $Li_3Cd$, $Li_3Sb$, $Li_4Si$, $Li_{4.4}Pb$, $Li_{4.4}Sn$, $LiC_6$, $Li_3FeN_2$, $Li_{2.6}Co_{0.4}N$, $Li_{2.6}Cu_{0.4}N$, SnO, $SnO_2$, GeO, $GeO_2$, $In_2O$, $In_2O_3$, PbO, $PbO_2$, $Pb_2O_3$, $Pb_3O_4$, $Ag_2O$, AgO, $Ag_2O_3$, $Sb_2O_3$, $Sb_2O_4$, $Sb_2O_5$, SiO, ZnO, CoO, NiO, and FeO. The carbon material served as the anode active material 102b is, for example, artificial graphite, natural graphite, carbon power, carbon fibers, carbon nanotubes, graphene, or a mixture thereof. In one embodiment, when the anode active material 102b is carbon powder, the particle size thereof is between about 30 nm to 30 μm.

The cathode 104 includes a cathode metal foil 104a and a cathode active material 104b. The cathode active material 104b may be coated or sputtered on the cathode metal foil 104a so as to form the cathode core. The cathode metal foil 104a is, for example, a copper foil, an aluminium foil, a nickel foil, or a highly conductive stainless steel foil. The cathode active material 104b is, for example, lithium or a lithium mixed transition metal oxide such as $LiMnO_2$, $LiMn_2O_4$, $LiCoO_2$, $Li_2Cr_2O_7$, $Li_2CrO_4$, $LiNiO_2$, $LiFeO_2$, $LiNi_xCo_yO_2$, $LiFePO_4$, $LiMn_xNi_yO_2$, $LiMn_xCo_yNi_zO_2$, $LiMc_{0.5}Mn_{1.5}O_4$, or a mixture thereof, wherein 0<x<1, 0<y<1, 0<z<1, x+y+z=1, and Mc is a divalent metal.

In one embodiment, the anode 102 and cathode 104 further include a polymer binder (not shown) to adhere the anode active material 102b to the anode metal foil 102a and the cathode active material 104b to the cathode metal foil 104a, respectively. The mechanical properties of the anode core and the cathode core are also improved. A suitable polymer binder may be, for example, polyvinylidene fluoride (PVDF), styrene-butadiene rubber (SBR), polyamide, melamine resin, or a mixture thereof.

The separator membrane 106 disposed between the anode 102 and the cathode 104 includes an insulating material such as polyethylene (PE), polypropylene (PP), or a multiple composite layer thereof, e.g. PE/PP/PE.

The major constituents of the electrolyte solution 108 are an organic solution, a lithium salt, and an additive. The organic solution is, for example, y-butyrolactone (GBL), ethylene carbonate (EC), propylene carbonate (PC), diethyl carbonate (DEC), propyl acetate (PA), dimethyl carbonate (DMC), ethylmethyl carbonate (EMC), or a combination thereof. The lithium salt is, for example, $LiPF_6$, $LiBF_4$, $LiAsF_6$, $LiSbF_6$, $LiClO_4$, $LiAlCl_4$, $LiGaCl_4$, $LiNO_3$, $LiC(SO_2CF_3)_3$, $LiN(SO_2CF_3)_2$, LiSCN, $LiO_3SCF_2CF_3$, $LiC_6F_5SO_3$, $LiO_2CCF_3$, $LiSO_3F$, $LiB(C_6H_5)_4$, $LiCF_3SO_3$, or a combination thereof. The additive is, for example, vinylene carbonate (VC).

As shown in FIG. 1B, the passivation protector 110 is disposed on the surface of the anode active material 102b, and the passivation protector 110 is a film deposition layer. The passivation protector 110 is formed by, for example, an oxide with continuous three dimensional structures, which is distributed uniformly on the surface of the anode active material 102b. The passivation protector 110 (i.e. the oxide with continuous three dimensional structures) is in contact with the electrolyte solution 108 in the accommodation region R. Therefore, the passivation protector 110 may suppress the decomposition of the electrolyte solution 108 on the surface of the anode active material 102b. The oxide with continuous three dimensional structures is at least one selected from, for example, the group consisting of a columnar structure oxide, a film structure oxide, a sheet structure oxide, a pin structure oxide, an array structure oxide, an irregular wrapping structure oxide, and a wire structure oxide. The passivation protector 110 includes a metal oxide or silicon oxide ($SiO_2$). The metal oxide is an oxide of a metal such as a transition metal (group B), a group IIIA metal, or a group IVA metal. In one embodiment, the metal oxide included in the passivation protector 110 may be aluminium oxide ($Al_2O_3$), titanium oxide ($TiO_2$), hafnium oxide ($HfO_2$), or a mixture thereof. In addition, the passivation protector 110 is formed by, for example, proceeding atomic layer deposition (ALD), chemical vapor deposition (CVD), or pulse laser deposition on the surface of the anode active material 102b, but the present invention is not limited thereto. The passivation protector 110 can be formed by any other method as long as the thickness of the passivation protector 110 is in a range between about 1 nm to 1 μm. In one embodiment, the thickness of the passivation protector 110 is about 10 nm to 100 nm.

Because the electrical conductivity of the passivation protector 110 according to embodiments of the present invention is low, it is important to control the thickness of the passivation protector 110 to both extend the lifetime of the battery at high temperature and promote the electrochemistry reaction of charge and discharge of the battery. The anode 102 cannot be effectively protected if the passivation protector 110 is too thin (e.g. thickness thereof is less than 1 nm), and in such a situation, the performance of the battery at high temperature deteriorates rapidly. On the other hand, the transfer of electrons and lithium ions between the anode 102 and the cathode 104 is impeded if the passivation protector 110 is too thick (e.g. thickness thereof is above 1 μm), and in such a situation, the performance of the battery is unsatisfactory at both high temperature and room temperature. Further, while the passivation protector 110 is exemplarily shown as film shape in FIGS. 1A and 1B, the present invention is not limited thereto. Instead, the scope of the present invention covers any lithium-ion battery of which the anode has a uniform passivation protector formed of an oxide with continuous three dimensional structures.

It should be specified that, at present, the solid electrolyte interface (SEI) of a lithium-ion battery is formed on the surface of the anode by the electrochemical reaction between the anode active material and the additive composed of small organic molecules in the electrolyte solution during the initial cycle of charge and discharge, and the solid electrolyte interface (SEI) including special organic material serves as the protection layer. However, the electrochemical reaction occurs inside of a packaged battery. It is difficult to control the electrochemical reaction, and thus the thickness of the solid electrolyte interface (SEI) as well as the distribution thereof on the surface of the anode is not uniform in general. Furthermore, a part of the solid electrolyte interface (SEI) is liable to decompose at high temperature, resulting in the deterioration of the performance of the battery. Other methods such as employing an electrode material which does not form the solid electrolyte interface (SEI), adding kinds of additives into the electrolyte solution to improve the properties of the solid electrolyte interface (SEI), or modifying the surface of the electrode prior to the package of the electrode, complicate the fabrication of the battery and in turn, reduce the practicability of the lithium-ion battery in high temperature environment (e.g. in electro mobile).

In comparison, by forming uniform passivation protector 110 with moderate thickness on the surface of the anode 102 (anode active material 102b), embodiments of the present invention suppress the decomposition the electrolyte, of which the by-product such as hydrofluoric acid (HF) corrupts and disintegrates the surface of the anode active material 102b. Accordingly, the cycle of charge and discharge of the battery is stabilized, and the lifetime of the lithium-ion battery at high temperature (e.g. 55° C. or above) is extended. The lithium-ion battery may thus be used in high temperature environment (e.g. used to drive the engine of the electro mobile). In addition, the artificial passivation protector 110 of the present invention may be formed on the surface of the commercially available anode core to effectively extend the lifetime of the battery operated at high temperature without changing the design of the battery, the material of the battery, or the electrolyte solution. Thus, the lithium-ion battery according the present invention is very competitive in the related application fields.

Figure 2:
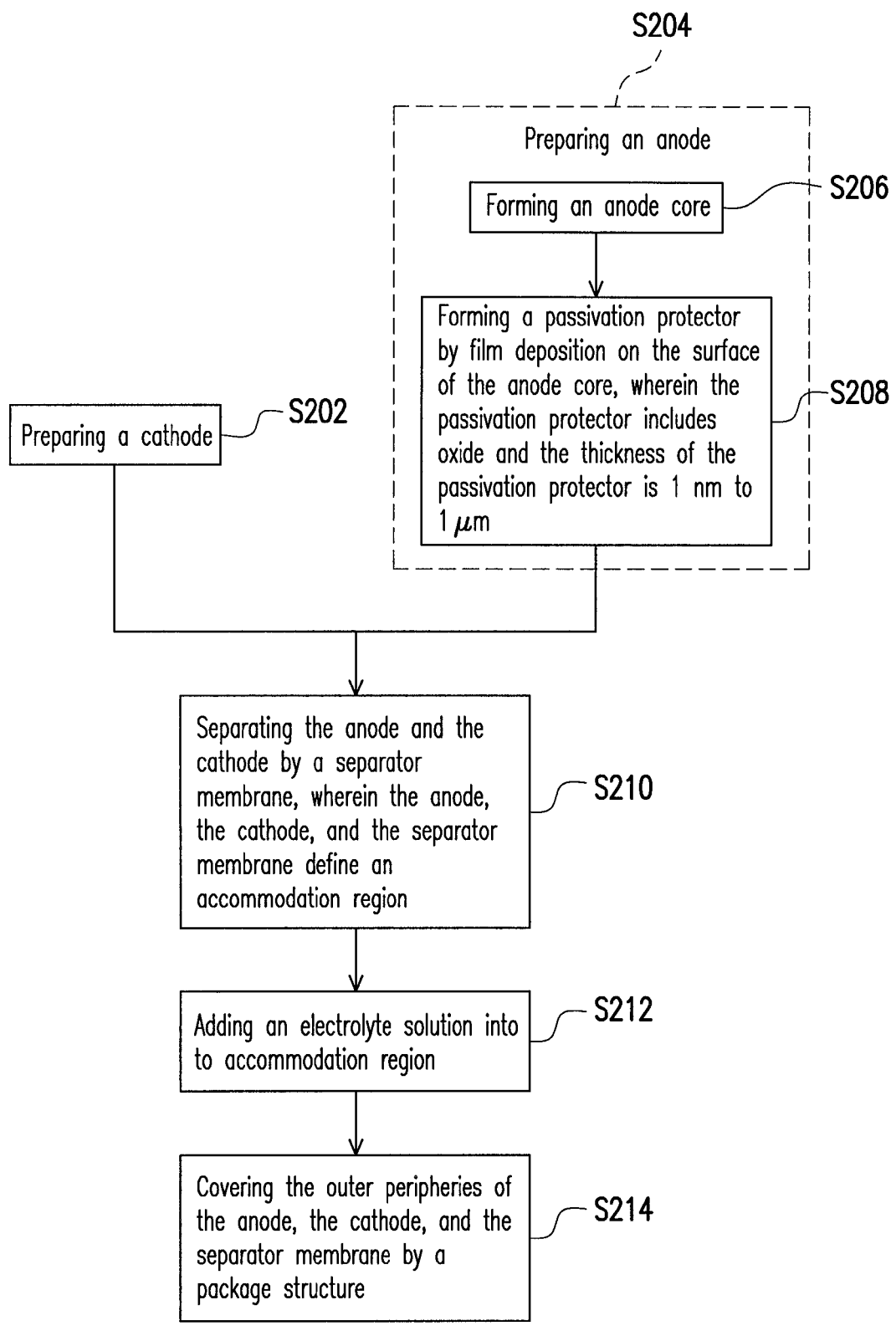
FIG. 2 is a flow chart of a fabrication process of a lithium-ion battery according to an embodiment of the present invention.

In the following, the method for fabricating a lithium-ion battery will be described, wherein the passivation protector is formed on the surface of the anode prior to the assembly of the lithium-ion battery. It should be noticed that the fabrication process is described so that those who have ordinary skills in the art can embody the present invention accordingly, but the scope of the present invention is not limited to the fabrication process as described. The material, composition, fabrication method, or fabrication sequence of other elements of the lithium-ion battery may be in accordance to the technique known to those who have ordinary skills in the related art, or according to embodiments described above, and are not limited to the embodiments described as follows. FIG. 2 is a flow chart of a fabrication process of a lithium-ion battery according to an embodiment of the present invention.

Referring to FIG. 2, at step S202, a cathode is fabricated by, for example, forming a cathode active material on the cathode metal foil. In one embodiment, the cathode active material may be coated or sputtered on the cathode metal foil, and the cathode core is then formed by a proper treatment (e.g. drying, compressing, and cutting).

At step S204, an anode is fabricated by forming the anode core (step S206) and then forming a passivation protector on the surface of the anode core by film deposition (step 208), wherein the passivation protector includes an oxide and the thickness of the passivation protector is 1 nm to 1 μm. Specifically, at step S206, the anode active material is particle-coated or sputtered on the anode metal foil, and the anode core is formed by a proper treatment (e.g. drying, compressing, and cutting).

Afterwards, at step 208, film deposition such as atomic layer deposition (ALD), chemical vapor deposition (CVD), or pulse laser deposition is carried out to form a uniform oxide with continuous three dimensional structures as the passivation protector. The thickness of the passivation protector is controlled in a range between 1 nm to 1 μm. As described herein, the oxide with continuous three dimensional structures included in the passivation protector may have different structures depending on the parameters of the film deposition, and is at least one selected from the group consisting of a columnar structure oxide, a film structure oxide, a sheet structure oxide, a pin structure oxide, an array structure oxide, an irregular wrapping structure oxide, and a wire structure oxide. The passivation protector includes a metal oxide or silicon oxide. In one embodiment, while metal oxide is deposited as the passivation protector by ALD, the precursor of ALD may be trimethyl aluminium, tetra isopropyl titanate, tetra isopropyl hafnate, or a mixture thereof. As described herein, the properties of the passivation protector on the surface of the anode may be modified, varied, or applied according to embodiments described above, and the details are omitted here.

At step S210, the anode and the cathode is separated by a separator membrane, wherein the anode, the cathode, and the separator membrane define an accommodation region. The separator membrane may include, for example, PP or other proper material.

At step S212, an electrolyte solution is added into the accommodation region, wherein the electrolyte solution includes an organic solution, a lithium salt, and an additive.

At step S214, the outer peripheries of the anode, the cathode, and the separator membrane are covered by a package structure to complete the fabrication of the lithium-ion battery.

It should be specially pointed out that, an uniform passivation protector with moderate thickness is formed on the surface of the anode prior to the package process of the lithium-ion battery. Therefore, an artificial passivation protector is formed on the surface of the electrode core without changing the structure of the battery, modifying the surface of the anode active material, or adjusting the formulation of the electrolyte solution. When the lithium-ion battery is operated at high temperature, the oxide composition with continuous three dimensional structures of the artificial passivation protector can effectively protect the structure of anode core and extend the lifetime of the battery.

Experimental Examples are presented in the following paragraph to verify the advantages (e.g. extending the lifetime of the battery) and illustrate the characteristics of the lithium-ion battery and the fabrication method according to embodiments of the present invention. Data of the Experimental Examples are used to show the results of the electrical measurement of the lithium-ion batteries according to the embodiments of the present invention after numerous cycles of charge and discharge. The scope of the present invention is not limited to these data.

Experimental Example 1

A lithium foil cut into a proper shape was placed on an aluminium foil or stainless steel sheet so as to form an cathode core. For example, $LiCoO_2$ is the cathode core of the lithium cobaltate-graphite full cell.

91 parts by weight of meso carbon micro beads (MCMB, artificial graphite), 6 parts by weight of PVDF, and 5 parts by weight of acetylene black were dispersed in N-methyl-2-pyrrolidinone (NMP). The slurry was coated on a copper foil, and then dried, compressed, and cut to form the anode core. The anode core was placed steadily in an environment with high humidity (e.g. the relative humidity >95%) for 24 hours so that the surface of the core was adsorbed with a sufficient amount of hydroxyl group. Next, the anode core was placed into the chamber of the ALD apparatus, which was then closed. The temperature of the chamber was controlled at 120° C., and the following steps were carried out in sequence: (1) a precursor (i.e. trimethyl aluminium) of a metal oxide carried by argon is fed into the chamber, and the inner pressure of the chamber was increased to 10 ton and kept at this value for 4 seconds; (2) the chamber was evacuated, and the inner pressure of the chamber was decreased to 0.5 torr and kept at this value for 12 seconds; (3) water vapor was fed into the chamber, and the inner pressure of the chamber was increased to 10 ton and kept at this value for 4 seconds; (4) the chamber was evacuated, and the inner pressure of the chamber was decreased to 0.5 torr and kept at this value for 12 seconds. In this Experimental Example, this cycle was carried out for 50 times, and a layer of $Al_2O_3$ (i.e. the passivation protector) with thickness between about 5 nm to 20 nm was formed on the surface the anode. It is proved by the experiments that the thickness of the passivation protector can be determined by numbers of reaction cycles. A thickness between about 50 nm to 200 nm can be achieved by 500 reaction cycles.

Figure 3B:
FIGS. 3A and 3B are SEM images of the surface of the lithium-ion battery according to Experimental Example 1 prior to and after the ALD treatment, respectively.
Figure 3A:
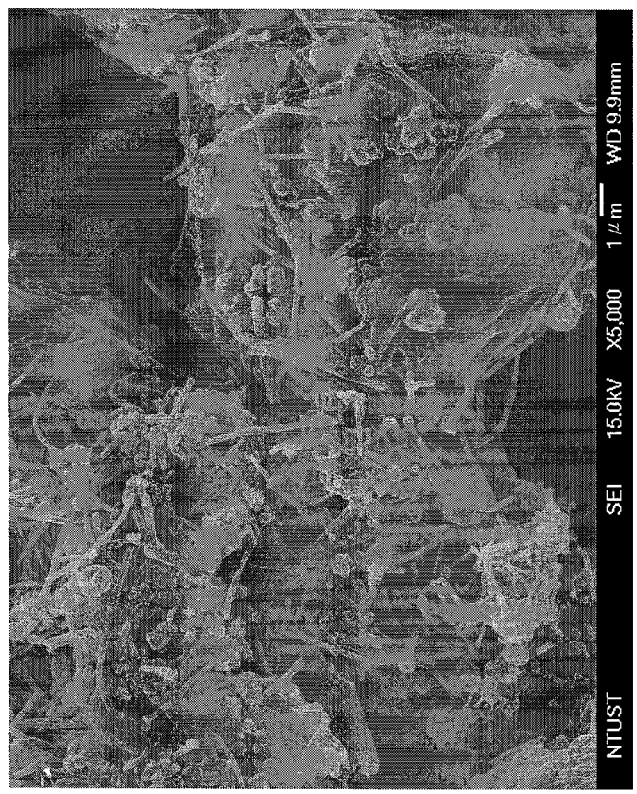
Figure 4B:
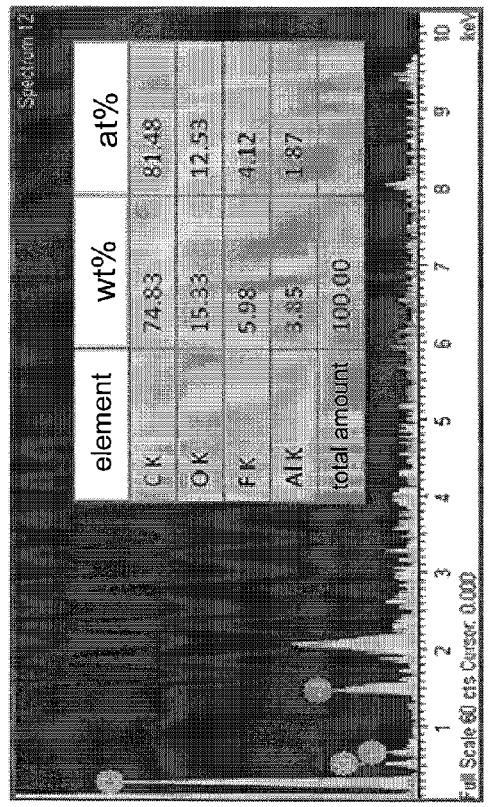
FIG. 4B is a diagram of the element analysis data of the region marked with "Spectrum 12" in FIG. 4A.
Figure 4A:
FIG. 4A is an SEM image of the columnar structure on the surface of the anode of the lithium-ion battery according to Experimental Example 1.

The passivation protector formed on the surface of the anode was observed and analyzed by the scanning electron microscopy (SEM). FIGS. 3A and 3B are SEM images of the surface of the anode of the lithium-ion battery according to Experimental Example 1 prior to and after the formation of the passivation protector by the ALD treatment, respectively. FIG. 4A is an SEM image of the columnar structure on the surface of the anode of the lithium-ion battery according to Experimental Example 1. FIG. 4B is a diagram of the element analysis data of the region marked with "Spectrum 12" in FIG. 4A. As shown in FIG. 3B, it can be seen that an amorphous metal oxide ($Al_2O_3$) film structure was formed on the surface of and between the highly crystalline MCMB of the anode. The columnar structure on the surface of the MCMB of the anode (Spectrum 12) was analyzed by energy-dispersive X-ray spectroscopy (EDS). The result shows that the columnar structure on the surface of the electrode included aluminium. This vindicates the success of the ALD treatment and shows the precision of the composition by the ALD process, as shown in FIGS. 4A and 4B.

Furthermore, 2 parts by volume of propylene carbonate (PC), 3 parts by volume of ethylene carbonate (EC), and 5 parts by volume of diethyl carbonate (DEC) were mixed so as to form the organic solvent for the electrolyte solution. $LiPF_6$ was added into the electrolyte solution as the lithium salt, and the concentration of the electrolyte solution was 1 M.

Then, the separator membrane (PP) was used to separate the anode and the cathode and, together with the anode and the cathode, define an accommodation region. Thereafter, the electrolyte solution was added into the accommodation region. Finally, the entire structure was packaged by a package structure to complete the fabrication of the lithium-ion battery. The test of charge and discharge of the battery was carried out at about 55° C., which is similar to the temperature near the engine of ordinary electro mobiles.

Experimental Example 2

The lithium-ion battery of Experimental Example 2 was fabricated similarly to the Experimental Example 1 except that the precursor of the metal oxide carried into the chamber of the ALD apparatus by argon was replaced by tetra isopropyl titanate, and the passivation protector formed on the surface of the anode was $TiO_2$. The steps of treating the surface of the anode by ALD, the fabrication of the electrode, and the solvent, the type of the lithium salt, and the concentration of the electrolyte solution of Experimental Example 2 were identical to those of Experimental Example 1. The test of charge and discharge was carried out at high temperature of about 55° C.

Experimental Example 3

The lithium-ion battery of Experimental Example 3 was fabricated similarly to the Experimental Example 1 except that the precursor of the metal oxide carried into the chamber of the ALD apparatus by argon was replaced by tetra isopropyl hafnate, and the passivation protector formed on the surface of the anode was $HfO_2$. The steps of treating the surface of the anode by ALD, the fabrication of the electrode, and the solvent, the type of the lithium salt, and the concentration of charge-discharge cycles of the lithium-ion batteries of Experimental Examples 1-3 and Comparative Examples 1-2.

TABLE 1

| Formulation | Electrical capacity of the battery at the $1^{st}$ cycle of discharge (mAh/g) | Efficiency of the $1^{st}$ cycle of charge and discharge (%) | Electrical capacity of the battery at the $5^{th}$ cycle of discharge (mAh/g) | Efficiency of the $5^{th}$ cycle of charge and discharge (%) | Electrical capacity of the battery at the $10^{th}$ cycle of discharge (mAh/g) | Efficiency of the $10^{th}$ cycle of charge and discharge (%) | Electrical capacity of the battery at the $20^{th}$ cycle of discharge (mAh/g) | Efficiency of the $20^{th}$ cycle of discharge charge and (%) |
| --- | --- | --- | --- | --- | --- | --- | --- | --- |
| Experimental Example 1 | 325.51 | 100.00 | 322.41 | 99.05 | 319.07 | 98.02 | 310.79 | 95.48 |
| Experimental Example 2 | 335.11 | 100.00 | 332.96 | 99.36 | 329.96 | 98.46 | 323.44 | 96.52 |
| Experimental Example 3 | 328.67 | 100.00 | 329.18 | 100.15 | 326.98 | 99.49 | 320.30 | 97.45 |
| Comparative Example 1 | 328.32 | 100.00 | 308.17 | 93.86 | 297.51 | 90.62 | 251.84 | 76.71 |
| Comparative Example 2 | 314.39 | 100.00 | 227.09 | 72.23 | 243.88 | 77.57 | 160.53 | 51.06 | the electrolyte solution of Experimental Example 3 were identical to those of Experimental Example 1. The test of charge and discharge was carried out at high temperature of about 55° C.

Comparative Example 1

The lithium-ion battery of Comparative Example 1 was fabricated similarly to the Experimental Example 1 except that there was no passivation protector formed on the surface of the anode by ALD. The fabrication of the electrode and the solvent, the type of the lithium salt, and the concentration of the electrolyte solution of Comparative Example 1 were identical to those of Experimental Example 1. The test of charge and discharge was carried out at high temperature of about 55° C.

Comparative Example 2

The lithium-ion battery of Comparative Example 2 was fabricated similarly to the Comparative Example 1 except that the metal oxide was formed on the surface of anode core by a sol-gel method. The test of charge and discharge was carried out at high temperature of about 55° C. Specifically, MCMB and tetra isopropyl titanate of which the weight was 2% of the MCMB were dispersed in alcohol for 10 hours. The product was dried in an oven at 120° C., heated to 450° C., and calcined for 8 hours. Then, the MCMB covered with $TiO_2$ by the sol-gel method was coated onto a copper foil, dried, compressed, and cut according to the method of Experimental Example 1 so as to form the anode core. Note that the as-prepared anode core was not treated by ALD.

Electrical Measurement

Test of Charge and Discharge:

The lithium-ion batteries of Experimental Examples 1-3 and Comparative Examples 1-2 were charged and discharged with a constant current/voltage at a high temperature of about 55° C. First, the battery was charged to 0.01 V with a constant current of 0.7 mA, until the current was equal to or less than 0.07 mA. Next, the battery was discharged to a cut-off voltage of 2 V with a constant current 0.7 mA. This cycle was repeated 20 times. The electrical capacity (milliamp hours per gram, mAh/g) and the battery efficiency (%) of the batteries of Experimental Examples 1-3 and Comparative Examples 1-2 were shown in Table 1. Further, FIG. 5 illustrates a curve diagram of the electrical capacity versus the number of charge-discharge cycles of the lithium-ion batteries of Experimental Examples 1-3 and Comparative Examples 1-2.

Figure 5:
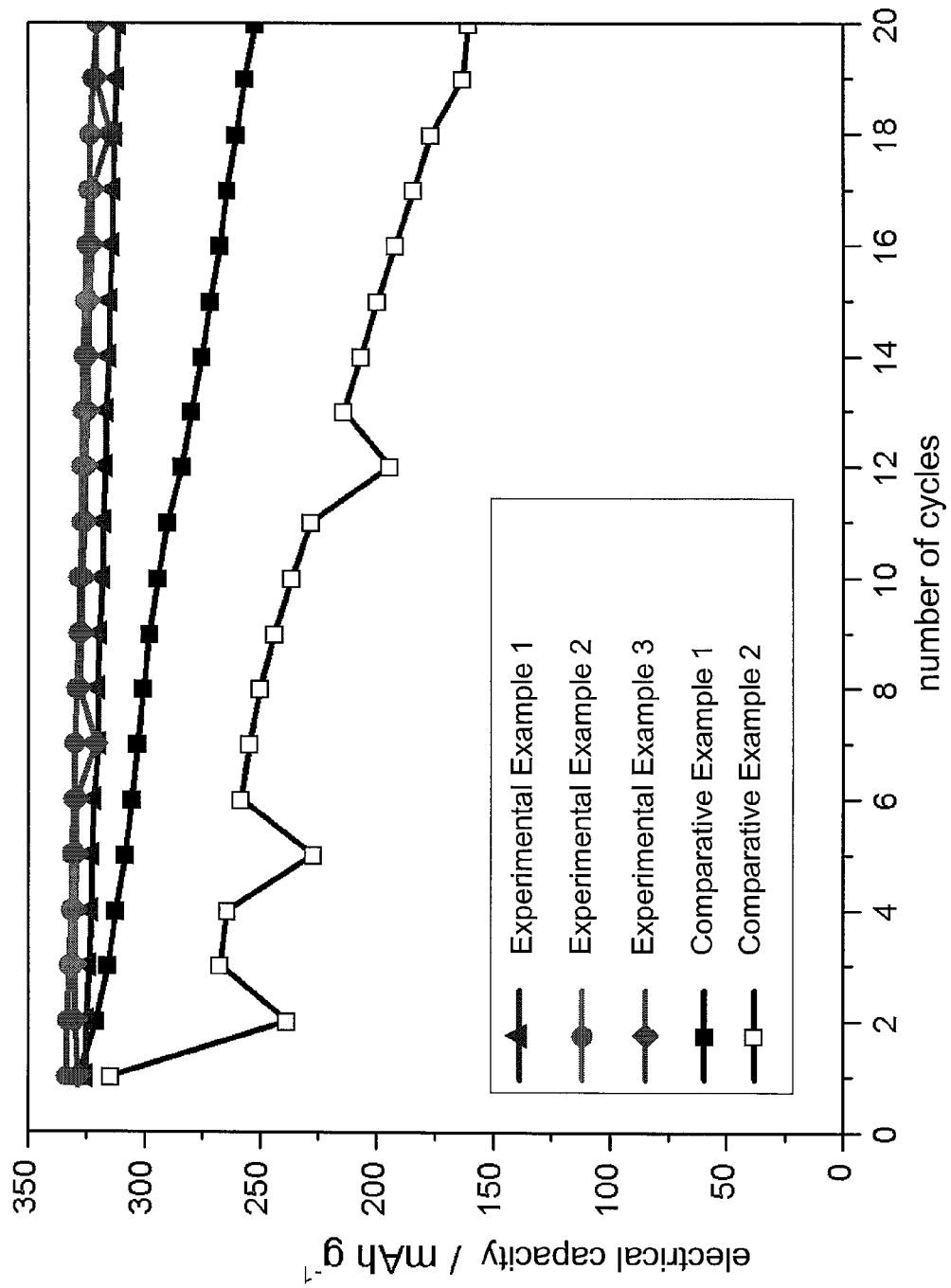
FIG. 5 illustrates a curve diagram of the electrical capacity versus the number of charge-discharge cycles of the lithium-ion battery of Experimental Example 1-3 and Comparative Example 1-2.

It may be seen from Table 1 and FIG. 5 that, at the $1^{st}$ cycle of charge and discharge, the electrical capacity of the lithium-ion batteries of Experimental Examples 1-3 and Comparative Example 1 were close to each other, and slightly higher than that of Comparative Example 2. The electrical capacity of the lithium-ion batteries of the Comparative Examples 1-2 decreased rapidly at high temperature after 20 cycles of charge and discharge. In contrary, the electrical capacity of the lithium-ion batteries of the Experimental Examples 1-3 were kept at 90% or above of the initial electrical capacity. In addition, although $TiO_2$ was coated on the surface of the MCMB by the sol-gel method in Comparative Example 2 to form the anode core, $TiO_2$ formed by the sol-gel method was too thick and thus electrons and lithium-ions cannot effectively transfer between the anode and the cathode. As shown in FIG. 5, after 2 cycles of charge and discharge, the electrical capacity of the lithium-ion battery of Comparative Example 2, in which $TiO_2$ was coated by sol-gel, is significantly lower than that of Experimental Example 2, in which $TiO_2$ was coated on the surface of the anode by ALD, and is even lower than that of Comparative Example 1, in which the surface of the anode was not specially treated.

As can be seen from the above data, after 20 cycles of charge and discharge at high temperature of about 55° C., the lithium-ion batteries of Experimental Examples 1-3 (i.e. lithium-ion batteries treated by ALD) had improved battery efficiencies as compared to the lithium-ion batteries of Comparative Examples 1-2 (i.e. lithium-ion batteries not treated by ALD). The energy density of the batteries of Experimental Examples was enhanced 21% according to calculation. In other words, the life time of the anode core coated with a metal oxide (artificial passivation protector) by ALD is longer than that of the anode core without any surface treatment, and especially longer than that of the anode core coated with a metal oxide by the sol-gel method at a temperature similar to the temperature near the engine of the electro mobile. Accordingly, forming a passivation protector by ALD prior to the package process extends the lifetime the lithium-ion battery significantly.

In summary, according to the present invention, a passivation protector with moderate thickness is uniformly formed on the surface of the anode prior to the package process. The decomposition of the electrolyte or the disintegration of the anode active material may thus be prevented. Furthermore, the lithium-ion battery with artificial passivation protector has an improved and stable battery efficiency and extended lift time even if the lithium-ion battery is operated at high temperature, and thus can be applied to electro mobile. In addition, the efficiency and performance of the battery are improved by forming an oxide on the surface of the existing anode without changing the design of the battery, the material of the electrode, and the formulation of the electrolyte solution. Therefore, the method according to the present invention can be integrated into the existing fabrication process. The fabrication cost may thus be reduced, and the lithium-ion battery according to the present invention is thus very competitive in the related application fields.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A lithium-ion battery, comprising:
    an anode;
    a cathode disposed opposite to the anode;
    a separator membrane disposed between the anode and the cathode, wherein the separator membrane, the anode, and the cathode define an accommodation region;
    an electrolyte solution in the accommodation region; and
    a passivation protector disposed on a surface of the anode, wherein the passivation protector is a film deposition layer and a thickness of the passivation protector is 1 nm to 1 μm, a material of the passivation protector is a material having an electrochemical activity, and the material having the electrochemical activity comprises hafnium oxide ($HfO_2$).

2. The lithium-ion battery according to claim 1, wherein the passivation protector comprises at least one selected from the group consisting of a columnar structure oxide, a film structure oxide, a sheet structure oxide, a pin structure oxide, an array structure oxide, an irregular wrapping structure oxide, and a wire structure oxide.

3. The lithium-ion battery according to claim 1, wherein the anode comprises a material of which a potential of lithium-ion intercalation material structure is less than 2 V.

4. The lithium-ion battery according to claim 1, wherein the anode comprises a material selected from the group consisting of artificial graphite, natural graphite, carbon powder, carbon fibers, carbon nanotubes, LiAl, LiZn, $Li_3Bi$, $Li_3Cd$, $Li_3Sb$, $Li_4Si$, $Li_{4.4}Pb$, $Li_{4.4}Sn$, $LiC_6$, $Li_3FeN_2$, $Li_{2.6}Co_{0.4}N$, $Li_{2.6}Cu_{0.4}N$, SnO, $SnO_2$, GeO, $GeO_2$, $In_2O$, $In_2O_3$, PbO, $PbO_2$, $Pb_2O_3$, $Pb_3O_4$, $Ag_2O$, AgO, $Ag_2O_3$, $Sb_2O_3$, $Sb_2O_4$, $Sb_2O_5$, SiO, ZnO, CoO, NiO, and FeO.

5. The lithium-ion battery according to claim 1, wherein the lithium-ion battery is operated at 55° C. or above.

* * * * *